(12) United States Patent
Eberlein et al.

(10) Patent No.: US 8,066,967 B2
(45) Date of Patent: Nov. 29, 2011

(54) SYSTEM AND METHOD FOR THE MANIPULATION, CLASSIFICATION SORTING, PURIFICATION, PLACEMENT, AND ALIGNMENT OF NANO FIBERS USING ELECTROSTATIC FORCES AND ELECTROGRAPHIC TECHNIQUES

(75) Inventors: Dietmar C Eberlein, Wappingers Falls, NY (US); Robert H Detig, New Providence, NJ (US)

(73) Assignee: Electrox Corporation, New Providence, NJ (US)

( * ) Notice: Subject to any disclaimer, the term of this patent is extended or adjusted under 35 U.S.C. 154(b) by 309 days.

(21) Appl. No.: 11/423,917

(22) Filed: Jun. 13, 2006

(65) Prior Publication Data

US 2008/0286521 A1 Nov. 20, 2008

Related U.S. Application Data

(60) Provisional application No. 60/689,683, filed on Jun. 13, 2005, provisional application No. 60/802,344, filed on May 22, 2006.

(51) Int. Cl.
| | |
|---|---|
| *C01B 31/02* | (2006.01) |
| *B01J 19/08* | (2006.01) |
| *B32B 5/12* | (2006.01) |
| *B01D 61/42* | (2006.01) |
| *B01D 35/06* | (2006.01) |

(52) U.S. Cl. ............ 423/461; 423/445 B; 428/114; 204/518; 204/627; 977/842; 977/844; 977/845; 977/746; 977/743; 977/900

(58) Field of Classification Search .......... 423/447.1, 423/447.2
See application file for complete search history.

(56) References Cited

U.S. PATENT DOCUMENTS

| | | | |
|---|---|---|---|
| 3,888,207 A | * | 6/1975 | Stutz et al. ............... 118/621 |
| 3,900,412 A | | 8/1975 | Kosel |
| 4,732,831 A | | 3/1988 | Riesenfeld et al. |
| 4,859,557 A | | 8/1989 | Detig et al. |
| 5,011,758 A | | 4/1991 | Detig et al. |
| 5,817,374 A | * | 10/1998 | Detig et al. ............... 427/466 |

(Continued)

OTHER PUBLICATIONS

Krupke et al.; Separation of Metallic from Semiconducting Single Walled Carbon Nanotubes; Science; vol. 301, pp. 344-347; Jul. 18, 2003.*

(Continued)

*Primary Examiner* — Melvin Mayes
*Assistant Examiner* — Guinever Gregorio
(74) *Attorney, Agent, or Firm* — Steven M. Hoffberg; Ostrolenk Faber LLP

(57) ABSTRACT

A system and method for the manipulation of nanofibers using electrostatic forces. The nanofibers may be provided in a liquid medium, and the nanofibers may be nano-scale (i.e. measured in nanometers). The process is sensitive to the charge properties of the nanofibers (charge could be inherent to material or the charge can be induced into the material through electrochemical means), and therefore may be used to sort or classify particles. The nanofibers may also be aligned according to electrical fields, and thus anisotropic effect exploited. Devices produced may be conductors, semi-conductors, active electronic devices, electron emitters, and the like. The nanofibers may be modified after deposition, for example to remove charge-influencing coatings to further enhance their performance, to enhance their adhesion to polymers for use as composite materials or result in the adhesion of the material at the proper location on a variety of different surfaces.

23 Claims, 14 Drawing Sheets

U.S. PATENT DOCUMENTS

| | | | |
|---|---|---|---|
| 5,817,874 | A | 10/1998 | Peet et al. |
| 5,825,723 | A * | 10/1998 | Hirokane et al. ......... 428/820.2 |
| 6,250,984 | B1 | 6/2001 | Jin et al. |
| 6,531,828 | B2 * | 3/2003 | Yaniv et al. ................ 315/169.3 |
| 6,741,019 | B1 * | 5/2004 | Filas et al. .................... 313/355 |
| 6,781,612 | B1 * | 8/2004 | Detig ............................ 347/112 |
| 6,815,130 | B2 | 11/2004 | Eberlein et al. |
| 6,900,580 | B2 * | 5/2005 | Dai et al. ...................... 313/309 |
| 7,404,910 | B1 * | 7/2008 | Kezuka et al. ................ 216/103 |
| 7,578,941 | B2 * | 8/2009 | Ziegler et al. ................. 210/639 |
| 7,638,252 | B2 * | 12/2009 | Stasiak et al. ............. 430/120.2 |
| 7,727,505 | B2 * | 6/2010 | Afazali-Ardakani et al. 423/460 |
| 7,781,635 | B1 * | 8/2010 | Sutto et al. .................... 585/836 |
| 7,785,472 | B2 * | 8/2010 | Murakoshi .................... 210/656 |
| 7,803,262 | B2 * | 9/2010 | Haik et al. .................... 204/557 |
| 2002/0130353 | A1 * | 9/2002 | Lieber et al. ................. 257/315 |
| 2003/0102222 | A1 * | 6/2003 | Zhou et al. .................... 205/109 |
| 2003/0111946 | A1 * | 6/2003 | Talin et al. .................... 313/311 |
| 2003/0180472 | A1 * | 9/2003 | Zhou et al. ................. 427/430.1 |
| 2004/0018371 | A1 | 1/2004 | Mao |
| 2004/0173506 | A1 * | 9/2004 | Doktycz et al. ................ 210/85 |
| 2005/0067349 | A1 * | 3/2005 | Crespi et al. .................. 210/634 |

OTHER PUBLICATIONS

Ho et al.; Electric Field-Induced Carbon Naotube Junction Formation; Applied Physics Letters; vol. 79, No. 2, pp. 260-262; Jul. 9, 2001.*

Kumar et al.; DC Electric Field Assisted Alignment of Carbon Nanotubes on Metal Electrodes; Solid State Electronics; 47, pp. 2075-2080; 2003.*

* cited by examiner

Induction Charging

Fully Functional Silicon Wafer

Coat with Photopolymer Mask

Pattern Mask

Charge Patterned Mask

Dielectrophoretic Alignment of Fibers Across a Wide Web

Formation of Nanotube Wires or Yarn

SYSTEM AND METHOD FOR THE MANIPULATION, CLASSIFICATION SORTING, PURIFICATION, PLACEMENT, AND ALIGNMENT OF NANO FIBERS USING ELECTROSTATIC FORCES AND ELECTROGRAPHIC TECHNIQUES

FIELD OF THE INVENTION

The present invention relates to the field of manipulation of fibers using electrostatic forces, and their use in material sorting, classification, placement, alignment, deposition, manipulation, and control.

BACKGROUND OF THE INVENTION

Nanofibers are a class of materials that have a variety of uses. These include: fillers for composite materials; electron emitters in vacuum devices; semiconductors, having properties suitable for high performance transistors (better than silicon, gallium-arsenide and other material); structural composites; etc. Typical production methods produce heterogeneous mixtures comprised of superfluous material, conductive and semi-conductive (quasi-insulative) fibers, and a large variability in fiber diameter and length. These materials can be long and highly anisotropic in shape and can be very difficult to handle in a dry state.

Some materials of interest are carbon nanotubes (CNT's). This includes single and multi walled varieties ("species") as well as conductive ("metallic") and semiconductive species and also extends to other conducting and semiconducting nanowires and nanofibers.

For example CNT's are grown from the gaseous phase in processes generally called chemical vapor deposition (CVD) and variations thereof. Other manufacturing techniques include the ARC method and laser ablation. Once produced these nanotubes are very small when compared to other particulate matter used in the electronics, structural composite, medical, pharmaceutical manufacturing today. It may be instructive to consider that a "large" single walled CNT may be 10 microns long by 2 nm diameter. By comparison, a "small" dry toner particle for a standard copy machine is usually 8 to 10 microns average diameter, and quite spherical. Recently, high quality color electrostatic printing machines like the NextPress 2100 have started to use "smaller" toner particle of approximately 5 micron diameter which are quite difficult to handle in the dry state and must be suitably coated in order to facilitate handling. When working with very small particles it is often desirable to disperse the particles in a liquid media.

Most of the techniques used to manufacture these nano-materials result in an agglomeration of material. For instance when growing CNT's, one often finds single and/or multi walled species coexisting with other materials such as amorphous carbon, carbon nano-particles and other material. In order to use CNT's for various potential commercial applications it is necessary to separate the various species from one another and to separate those species possessing different characteristics (e.g. electrochemical properties, magnitude of conductivity etc). The process of separation is often referred to as purification. Current purification techniques have only achieved limited success. CNT's have a wide range of properties that make them versatile material for numerous commercial applications. For example CNTs: are excellent conductors; conducting electricity better than copper; conducting heat better than diamonds. They are 100 times stronger than steel at $\frac{1}{16}$ the weight and have carrier mobilities 100 times greater than silicon—resulting in better high frequency transistors for electronic parts. They also have desirable magnetic properties. In order to take full advantage of these various properties it becomes important to separate one species of CNT from the other.

Some of the major hurdles confronting the industry are; how to separate conductive (metallic) from semi conductive species, and how to manipulate, align and accurately place these materials in a cost effective manner, particularly given their small size and acicular geometry (0.7 nanometer×1-50 micron). While some manipulation and placement techniques have achieved modest success, there are very few (if any) scalable techniques that have resulted in the ability to align and accurately place one or more nanofibers and/or CNT in an orderly manner at a target location. Current placement techniques include mechanical manipulation via "nano-tweezers", printing inks via ink jet systems, and dispensing small drops of the nano-material contained in a liquid through pipettes. Most of these techniques have demonstrated at best satisfactory results, are generally expensive, difficult to scale, and/or have performance limitations, for example.

Given the wide range of properties, CNTs are being considered for numerous commercial and industrial applications. CNT related discoveries have spurred other work in semiconducting nanowires. Nano-wire species of various types can yield superior electronic performance to that of bulk, single crystal material. This has led to the desire to understand and classify these materials as well as discover new ways to manufacture, process, and manipulate them. For example for high performance transistor manufacture and other applications requiring high performance semiconducting parts, nanowires comprised CNT's and other compounds such as Cadmium selenide, Indium arsenide/phosphide, Gallium Indium Phosphide, Gallium Arsenide, Gallium Nitride, and Silicon Carbide among other compounds as well as pure Silicon are applicable to the techniques which we intend to describe.

Another issue that confronts industry is the ability to print useful electrically conductive materials. In general printable conductive inks offer insufficient conductivity while nano powder inks offer insufficient thicknesses to be commercially usefully. For example conductive traces produced with silver filled resin inks produce structures which have about 5% of the conductivity of traces made of equivalent solid metal (e.g. etched aluminum or copper foil). Nano particle inks can achieve 20% to 30% of the conductivity of comparable solid metals but the traces are very thin often less than 500 nanometers in thickness and require a sintering step typically at temperatures of 150 C for approximately 30 minutes. Neither of these solutions would produce sufficient conductivity for most electrical applications. Hybrid circuit technology (e.g. silver filled glasses) can achieve acceptable conductivity but thermal processing often occurring at temperatures ranging from 500 C to 900 C make this technology unsuitable for many different types of substrates.

See, U.S. Pat. No. 6,781,612, and NIP-19 Conference Publication entitled—"Electrostatic Printing of Functional Toner Materials for Electronic Manufacturing Applications", IS&T NIP Conf, New Orleans, October 2003, expressly incorporated herein by reference.

U.S. Pat. No. 6,781,612 teaches that typical range of toner bath conductivity is of the order 10 to 100 pico mho/cm ($10^{+11}$ to $10^{+10}$ Ω·cm resistivity), and up to 169 pico mho/cm (18 hertz test that measures back and forth flow of electrons, ions, and charged toner particles). A typical toner base is Isopar® G, though Isopar® H and L are also employed. ISOPAR® is the brand name of Exxon for eight grades of high-purity isoparaffinic solvents with narrow boiling ranges.

SUMMARY OF THE INVENTION

This invention provides systems and methods for manipulating nanofibers, carbon nanotubes, and various other types of highly anisotropic structures, using electrostatic principles. While some aspects of the interaction of fibers with electric fields are similar to the response of relatively isotropic particles, the anisotropy adds another level of complexity on electrostatic, mechanical and hydraulic/thermodynamic levels. Thus, in electrically charging an anisotropic particle, the result is generally an uneven charge distribution along its length. When a mass of fibers are charged, their interaction cannot simply be modeled as a set of charged particles.

The fibers may be provided in a liquid medium, and the fibers may be nano-scale (i.e. measured in nanometers). The process is generally sensitive to the charge properties of the fibers. The charge could be inherent to material, or induced into the material through electrostatic, electrochemical, or triboelectric means, and therefore may be used to sort or classify particles. The fibers may also be aligned according to electrical fields, and thus anisotropic effects exploited.

The fibers processed according to the present invention may be used to form devices, such as conductors, semiconductors, active electronic devices, electron emitters, and the like. The fibers may be modified after deposition, for example to remove charge-influencing coatings to further enhance their performance, to enhance their adhesion to polymers for use as composite materials, or result in the adhesion of the material at the proper location on a variety of different surfaces.

One application for the present technology is the printing of "metallic" (i.e., electrically conductive) nanotubes (e.g., CNT) on dielectric surfaces to achieve traces of substantial electrical conductivity. In the same manner, heat, photons or phonons may be selectively conducted through the organized nanotubes.

Other applications of the present invention is the sorting of nanofibers according to their level of electrical conductivity, or more generally, their electrical or electronic properties; selective spatial placement of nanofibers with fiber axis directional control; and the construction of field effect transistors or other electronic, optical, thermal, and/or quantum effect devices.

CNTs may be sorted by levels of conductivity. First, conductive particles may be collected, and then these can be further sub-separated by levels of conductivity by modulating the product of electric field and the exposure time window. CNTs may also be sorted by electric charge: starting with a dielectric film on a bottom layer, switching polarity of the field will cause particles with intrinsic charge (+ or −) to move selectively, and therefore they can be sorted by electric charge. CNTs may also be sorted by their chemical properties: particles with differing surface chemistry can be sorted using various polyelectrolyte materials (a.k.a. charge directors)—this results in sorting by surface chemistry. For instance particles possessing acidic surfaces make good negatively charged toners while those possessing hydroxyl surfaces make good positively charged ones.

One Embodiment of the invention employs classic electrostatic techniques for induction charging, similar to those currently used in ore separation and fiber flocking processes, as well as dry and liquid toner techniques from the electrophotographic industry to: sort and/or purify nanofibers and mixed particulates according to their level of electrical conductivity, other electrical properties or surface chemistry; coat objects with nanofibers; align fibers; and spatially image nanofiber materials. In particular, a preferred implementation is employed to purify CNT's (conductive and non conductive) from amorphous carbon, other carbon nano-particles, and debris which are coproduced.

The aspect of the invention involves the electrostatic printing CNT toners using traditional electrographic technology of printing plates and electrostatic forces. While the invention will be described using a fixed configuration photopolymer plate, one could use the familiar optically addressed plates like selenium, silicon, or the organic photoconductive (OPC's) used in copy machines and laser printers.

The basic electrostatic printing plate (Reisenfield, U.S. Pat. No. 4,732,831, expressly incorporated herein by reference) may be over coated (Detig, U.S. Pat. No. 4,859,557 and U.S. Pat. No. 5,011,758, expressly incorporated herein by reference), or provided as a tiered configuration photo polymer plate (Eberlein, U.S. Pat. No. 6,815,130, expressly incorporated herein by reference.

DETAILED DESCRIPTION OF THE INVENTION

Sorting

Figures 1A, 1B:
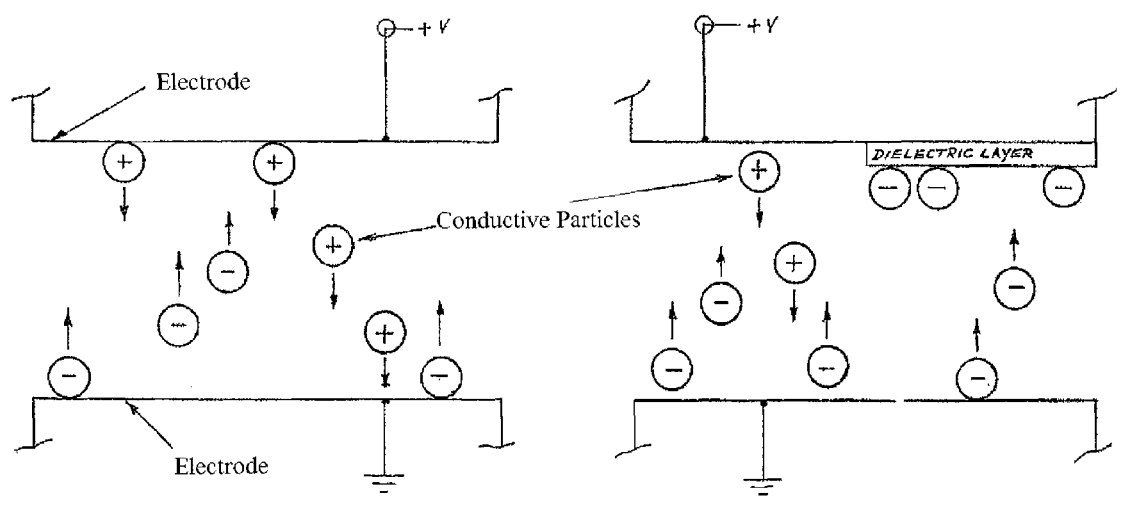
FIG. 1A show the classic induction charging/migration experiment
FIG. 1B shows the same experiment with a low leakage dielectric layer interposed in the "flight path".

Small particles are difficult to move with electrical fields because of their high self adhesive forces, formerly called van der Waals forces. The difficulty in moving small particles when dry, suggests that a liquid media be employed, where van der Waals forces are much smaller. Small toner systems in liquid media are of the order 50 to 250 nm, while dry systems exhibit small particle limits at 8 to 15 microns (50 to 100 times larger). It may be possible to impart an electrochemical charge on the particles using liquid toner techniques One important need is the sorting of conductive from non-conductive fibers. An approach is shown in FIGS. 1A and 1B. This is a classic electrostatic induction experiment. An electric field causes a charge to be induced in conductive particles, eventually causing them to move. If they travel to contact the conductive plates, they discharge and recharge in the reverse mode and "fly" back. They continue this reciprocating movement until a dense "tornado" of particles is formed. If the particles "flight path" is interrupted by a film capable of holding charge (PET or fluorpolymer films like Teflon®), the particles are held in place. They do not discharge, and are held fast by the electrostatic forces. Insulating particles that have a charge due to frictional electrification (i.e. tribo-electrofication) can be collected on the top conductive plate with, at first, one polarity of voltage, then with the opposite polarity; to sort the insulative particles from the conductive ones captured on the adjacent insulative film. By slightly varying the gap spacing, the particles will migrate toward the wider opening as described by Jean Cross, "Electrostatics, Theory and Applications." (Hilary Sugden).

Figure 2:
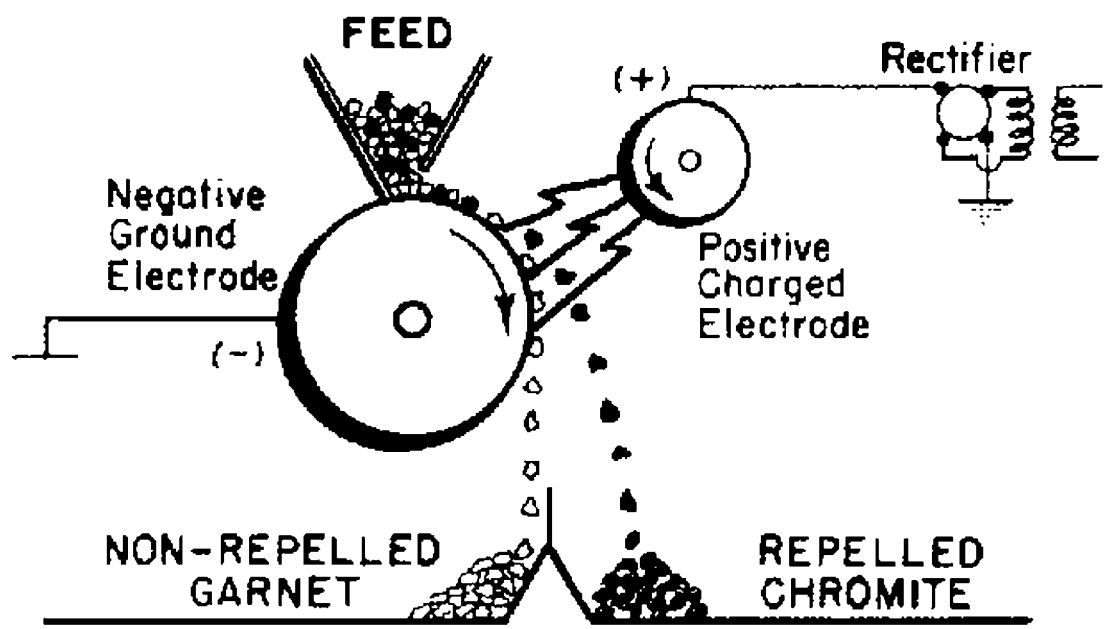
FIG. 2 shows how the basic induction charging experiment can be used to separate conductive/non conductive particles in ore

FIG. 2 shows how this basic phenomenon is used to separate conductive/non-conductive fractions in ores. This is a widely used in the mining, ore processing technology. As shown, a rotating drum may be used.

A variation of this technique is to time modulate the applied electric field (Product of voltage and time "on") so more conductive particles can be moved while particles of lesser conductivity will never start to move. Referring back to FIG. 1, by reducing the time of the applied voltage, one can sort by conductivity (less conductive take longer to charge up sufficiently). Further, by spreading out the gap between plates, one can achieve a "spectra" representing conductivity, where the final landing location is a measure of particle conductivity.

In order to sort fibers by length, a photoconductive or mask-patterned drum may be provided with characteristic spacing of the dielectric or conductivity pattern to attract certain fibers and reject others. Indeed, if a photoconductive drum or plate is employed, the photopattern may be changed over time, allowing separation of fibers into a number of "bins", for example 3 or more, instead of the binary separation shown.

Figure 3:
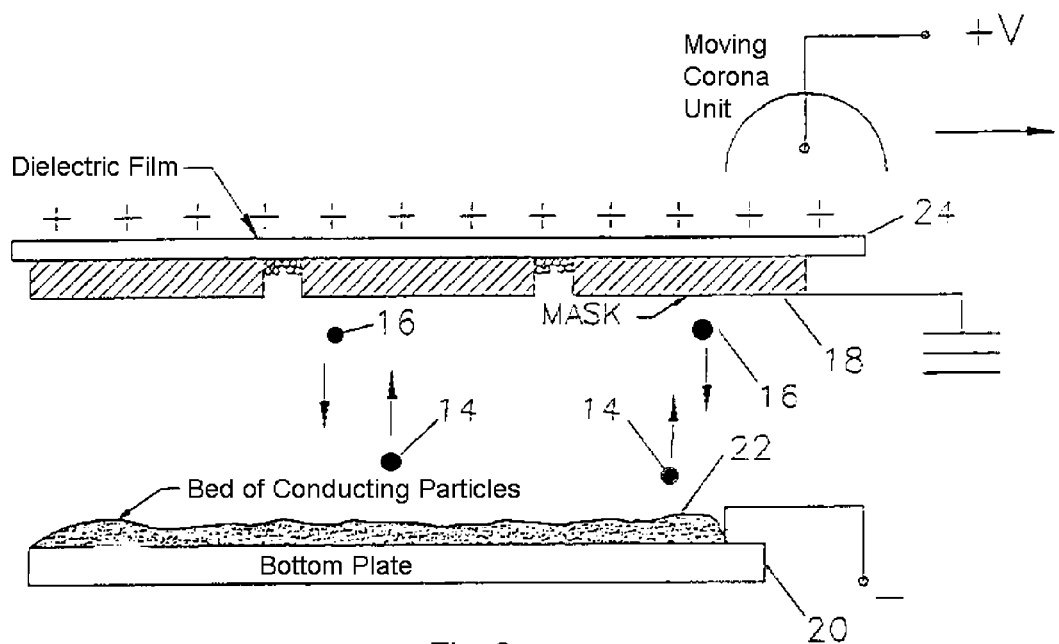
FIGS. 3 and 4 show how a similar process to that shown in FIG. 2 may be used to pattern conducting particles on a dielectric layer
Figure 4:
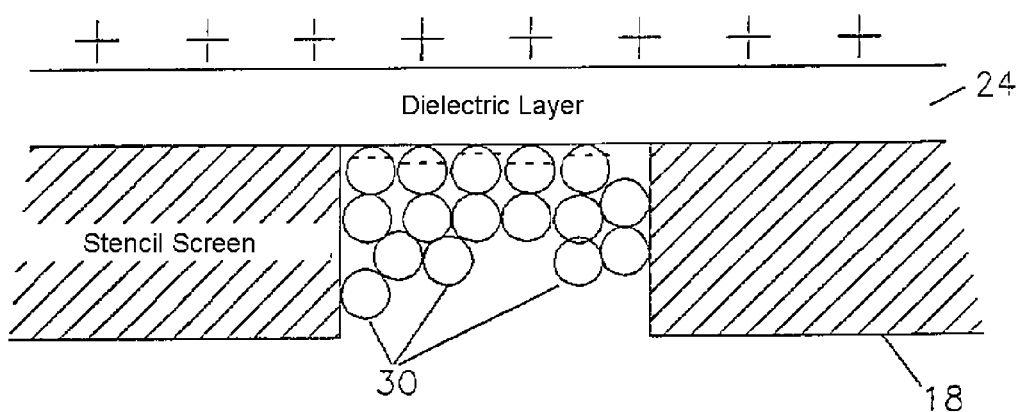

FIGS. 3 and 4 show how this basic technique is used to pattern non-coated conductive particles, mostly metals through a metal stencil or conductive silk screen. See U.S. Pat. No. 5,817,374, expressly incorporated herein by reference. Thus, the present invention proposes, inter alia, to apply known electrostatic technologies to fibrous particulates, modified as necessary to accommodate the mechanical aspect of anisotropic particles as well as their different electrostatic properties.

Coating and Alignment

Figure 5:
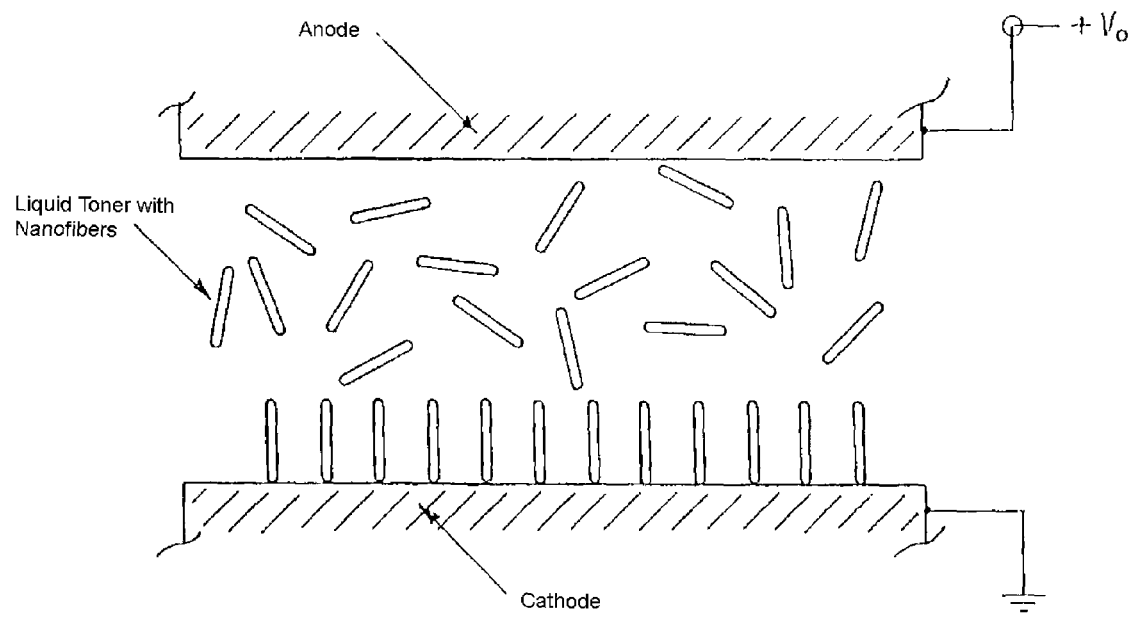
FIG. 5 shows how nanofibers can be uniformly coated on a conducting substrate, in a liquid medium because of the small size of the particles

FIG. 5 shows how nanofibers can be uniformly coated on a surface and aligned by the applied electric field. Since the particles are small, this is best done in a liquid dielectric medium. This process is a close approximation of the "flocking" of dry fibers to produce synthetic furs, a widely used industrial process. It is noted that, after the fibers are adhered to the cathode, they become asymmetric, allowing one end only to be derivitized or otherwise subject to different mechanical, electrical, or chemical conditions. Thus, by selectively aligning the particles, a symmetric fiber may be transformed into an asymmetric fiber. The ability to uniformly coat broad areas or surfaces with nano-fibers aligned perpendicularly to the planar surface may be useful in the production of broad area electron emitters.

The density and uniformity of the fiber coating (in fibers per $cm^2$) depends on the fiber density in the liquid diluent medium, and how the fibers are replenished, made uniform, etc.

Once the fibers are properly coated and aligned, they may be fixed in place. One technique is to dissolve a small amount of resin in the diluent. After the fibers are coated and aligned, and with the electric field still applied; the liquid is drained from the space between the electrodes. There will be a residual amount of diluent at the base of the fibers containing the dissolved resin. As the solvent evaporates the resin forms a film and holds the fibers in place. Such techniques or ones very similar have been used extensively for many years to self-fix resinous toners after the drying of a diluent hydrocarbon liquid.

Figure 7:
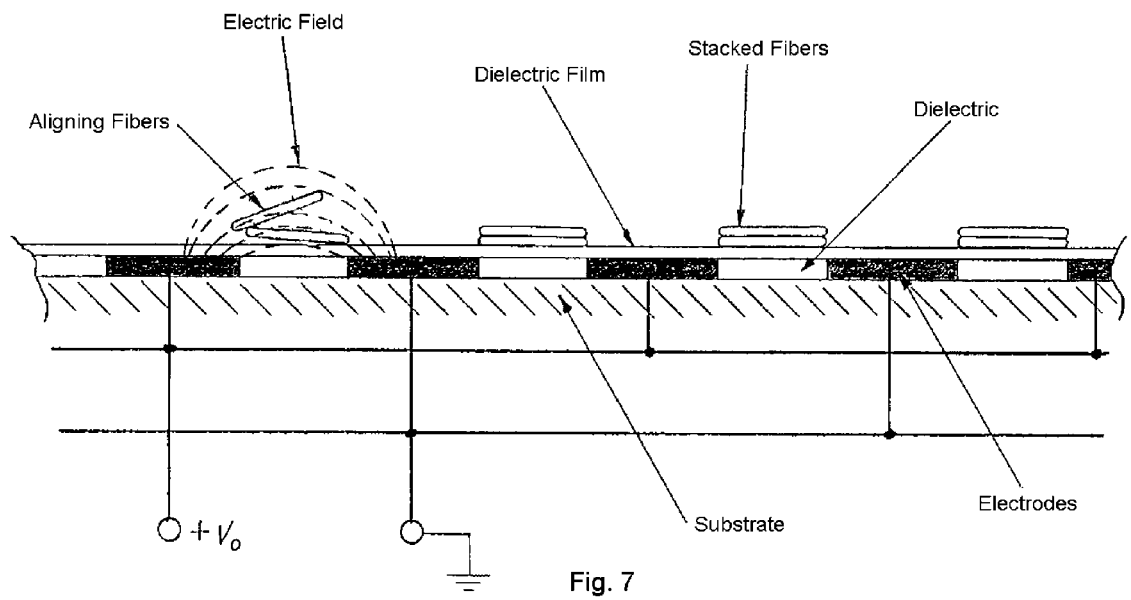
FIG. 7 shows how nanofibers can be aligned

FIG. 7 shows the horizontal alignment of fibers along the plane of an electrically active surface. Inter-digital electrodes are driven by a high ac or dc voltage. The electric fields that fringe through the air parallel to the surface, pick up fibers due to dielectrophoretic forces; which both attract fibers and cause them to align parallel to the fields. A similar approach was reported by Detig as a means to place Si die for inexpensive RFID tag assembly. see Soc Info Disp, NIP-20 Nov. 2004 "Electrophorectic Self Assembly", expressly incorporated herein by reference.

Imaging or Spatial Placement

Figures 6A, 6B:
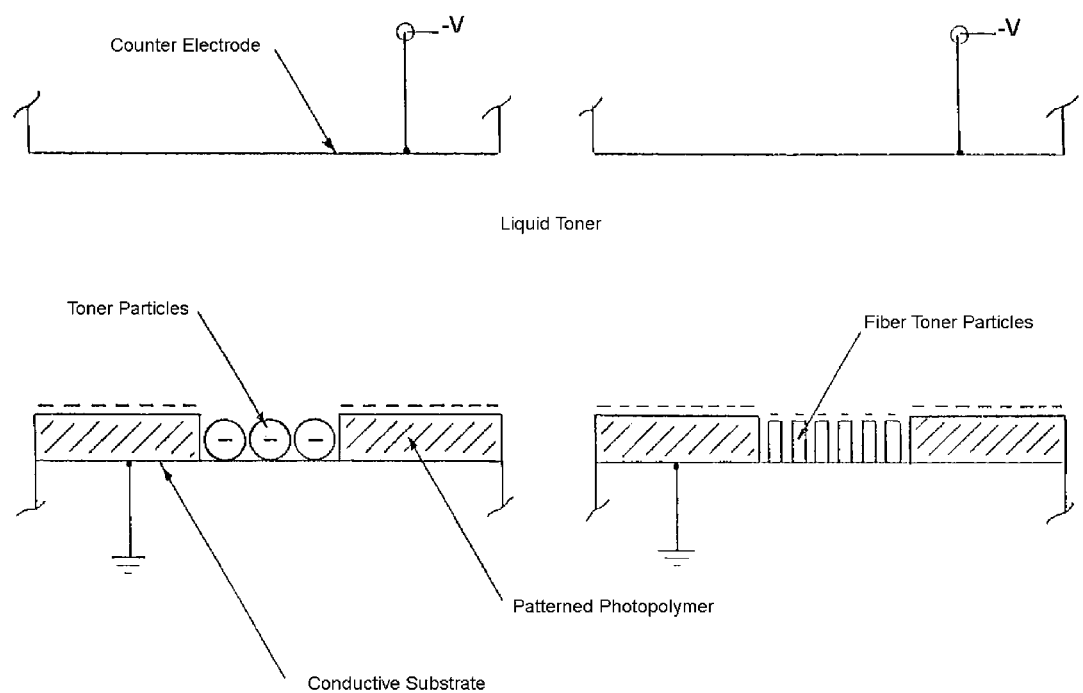
FIGS. 6A & 6B shows the imaging of particles, first spheres and then fibers, in the trenches of printing plate

FIGS. 6A and 6B show spheres in the cavities of a trenched printing plate. See, e.g., U.S. Pat. No. 6,815,130, Eberlein, et. al., expressly incorporated herein by reference. This same plate configuration can be used to both image the fibers (or spatial placement) and align them in the holes of the plate. Deep in the holes the electric field is substantially normal to the surface of the plate so the fibers also extend normal to the surface generally as shown. Note in this case the toner charge polarity is the same as the sensitizing polarity of charge.

FIG. 7 shows that it should be possible to align many nano fibers in a massively parallel manner. In this illustration, a configuration of inter-digital conductors are laminated with a dielectric film overlay. Alternating electrodes (denoted in FIG. 7 as the black areas under stacks of fibers) have a high DC voltages between. Electric fields are produced in between each electrode pair. The surface is then exposed to toner containing nano-fibers. The fibers will be attracted and aligned to the surface by dielectrophoretic forces.

Building a Carbon Nano Tube (CNT) Field Effect Transistor (FET).

Figure 8:
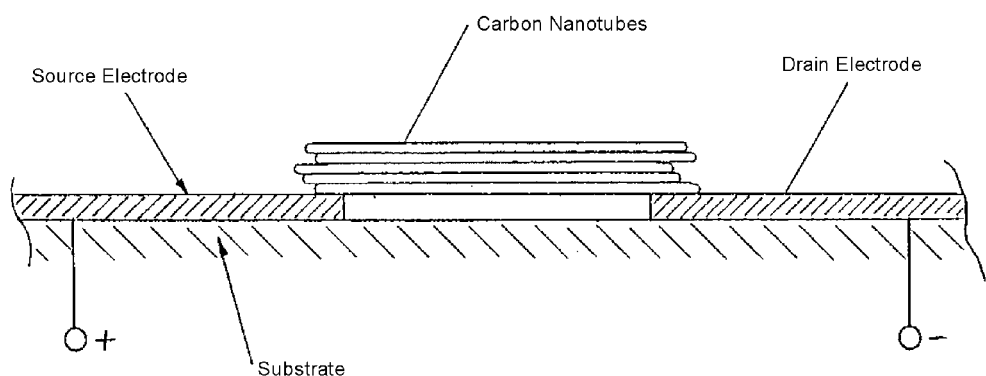
FIG. 8 shows details of construction of a carbon nanotube (CNT) field effect transistor (FET)
Figure 9:
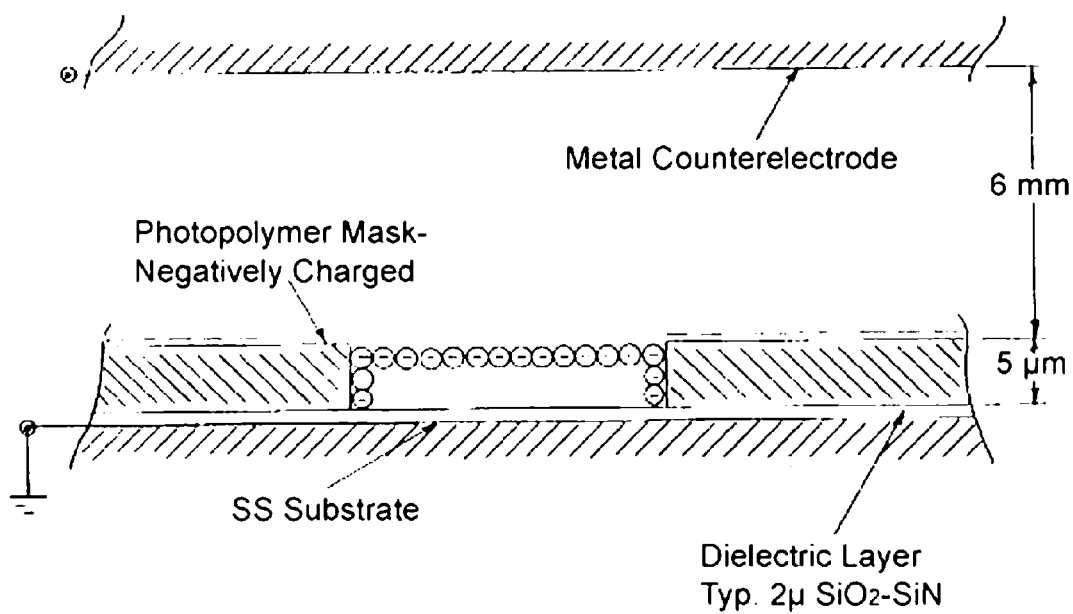
FIG. 9 shows a traditional electrostatic printing plate used in a CNT alignment process.

FIG. 8 shows a representation of a CNT-FET. The surface source/drain metallization pattern has a voltage across it, generating an electric field directly between the electrodes, but also fringing above it. These fields will attract fibers as shown in FIG. 8. After drying of the diluent liquid, the nano tubes are "cemented" in place to make Ohmic contact with the source/drain electrodes. The gate dielectric is placed or deposited over the fibers, with the metal gate electrode provided over that. It is possible to form the various layers sequentially using electrostatic principles, so long as the subsequent processing steps do not dislodge or disrupt the results of earlier steps.

The processes described depend on two forces:
The coulombic force=charge times electrostatic field intensity The dielectrophoretic force=permittivity times the gradient of the electrostatic field.

Since the particles in question are, for the most part conductive, they have a substantially large "effective" dielectric constant. Establishing a charge on the particle is facilitated by an appropriate coating of acidic/basic functionality, reacting with appropriate poly-electrolytes (called charge directors). In some cases, these coatings may be temporary or removable. That is, during the deposition process, the coating is effective, and after the fibers are process, the coating may be removed or deactivated. Typical deactivating conditions include heat, light, chemical or pH conditions, or the like.

Material Properties and Sorting

Since the starting sample of the raw material are expected to be a mixture of carbon nanotube agglomerates ("ropes"), and amorphous carbon debris, one objective is to try to separate these two components, referred to as phase 1. In the second phase ("phase 2") the various electrical properties of the rope material will be determined. By performing some basic induction experiments in the liquid state, we expect to determine which materials are intrinsically charged, which are conductive but uncharged, and which are neither conductive nor chargeable. The third phase ("phase 3") addresses those component particles exhibiting non conductivity and no apparent ability to be charged. In these cases an electrochemical charge will be induced synthetically on the material by dispersing it in a diluent with an appropriate charge director (polyelectrolyte) material. Small samples of liquid (e.g. 50 ml to 100 ml) comprised of 0.5% to 1% material content will be stirred in a beaker with an appropriate amount of charge director (polyelectrolyte) material in an attempt to induce an electrochemical charge on the particles. Four industry standard charge directors: Negative type, Positive type, Polyvinyl lecithin (HP/Indigo) Barium Petronate® (barium salt of an alkyl aryl sulfonate) and Zr Hex Cem® (CAS No: 22464-99-9 Hexanoicacid, 2-ethyl-, zirconium salt) (OMG Chem.) Hunt Imaging #12-76, may be used. Typically, the fiber-diluent-charge director mixture is stirred for at least 1 hour to gain uniformity.

Imaging

The suspended fiber may then be used in plating and/or printing, with, for example unpatterned plates, charge-patterned plates, and/or trenched plates. Trenched plates are preferred.

Figure 11A:
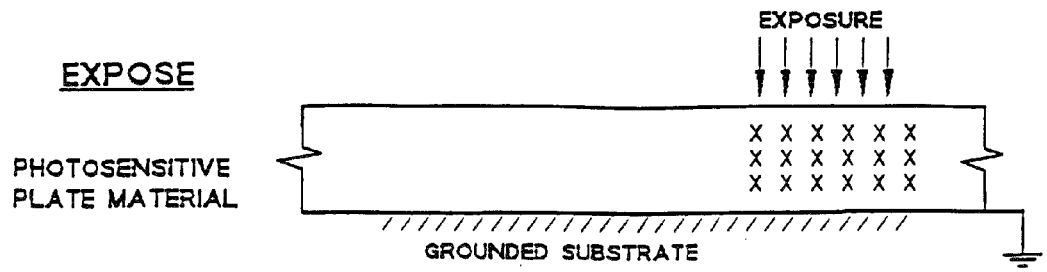
FIGS. 11A, 11B and 11C shows the configuration of an Embodiment of the invention which shows that the electrostatic fields may be shaped.
Figure 11B:
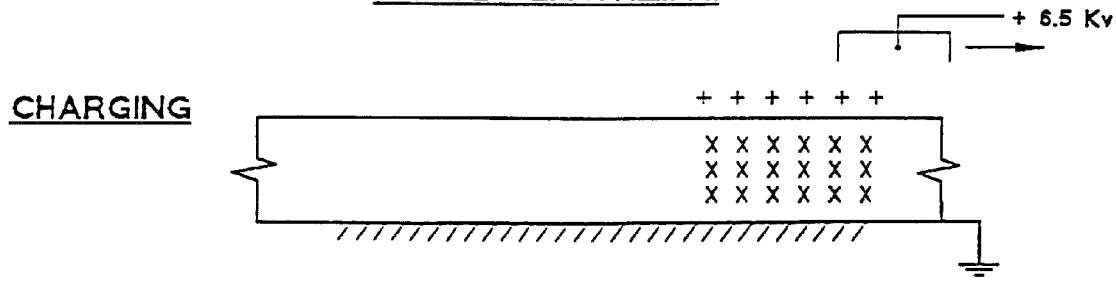
Figure 11C:
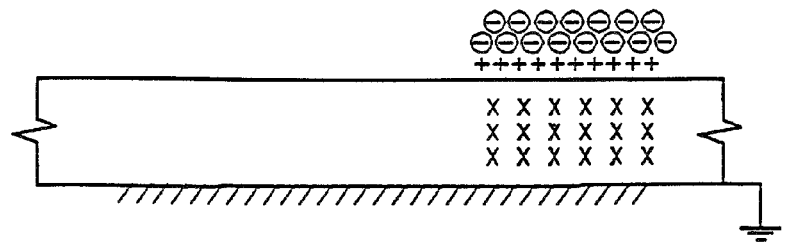
Figure 12A:
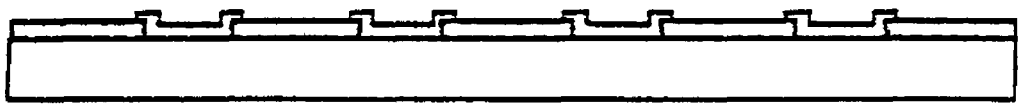
FIGS. 12A, 12B, 12C and 12D show a process for producing a charge patterned mask on a functional silicon wafer, suitable for selective deposition and alignment of nanofibers.
Figure 12B:
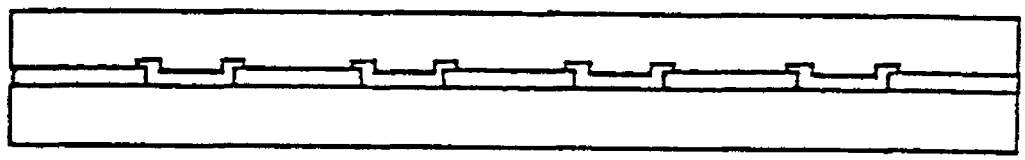
Figure 12C:
Figure 12D:
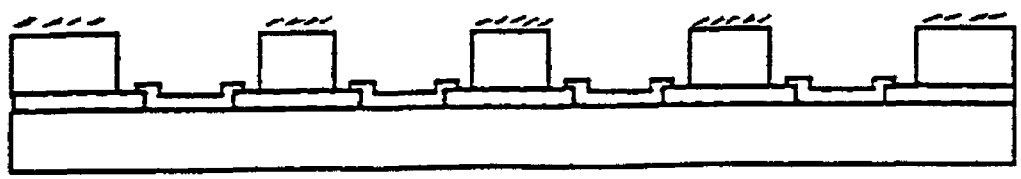

FIGS. 11A, 11B and 11C demonstrate the standard Reisenfeld plate and the three steps for making and using it: expose photopolymer to cross-link it (FIG. 11A); charge cross-linked region (FIG. 11B); and develop with toner particles of opposite sign to the charging (FIG. 11C).

Figure 10:
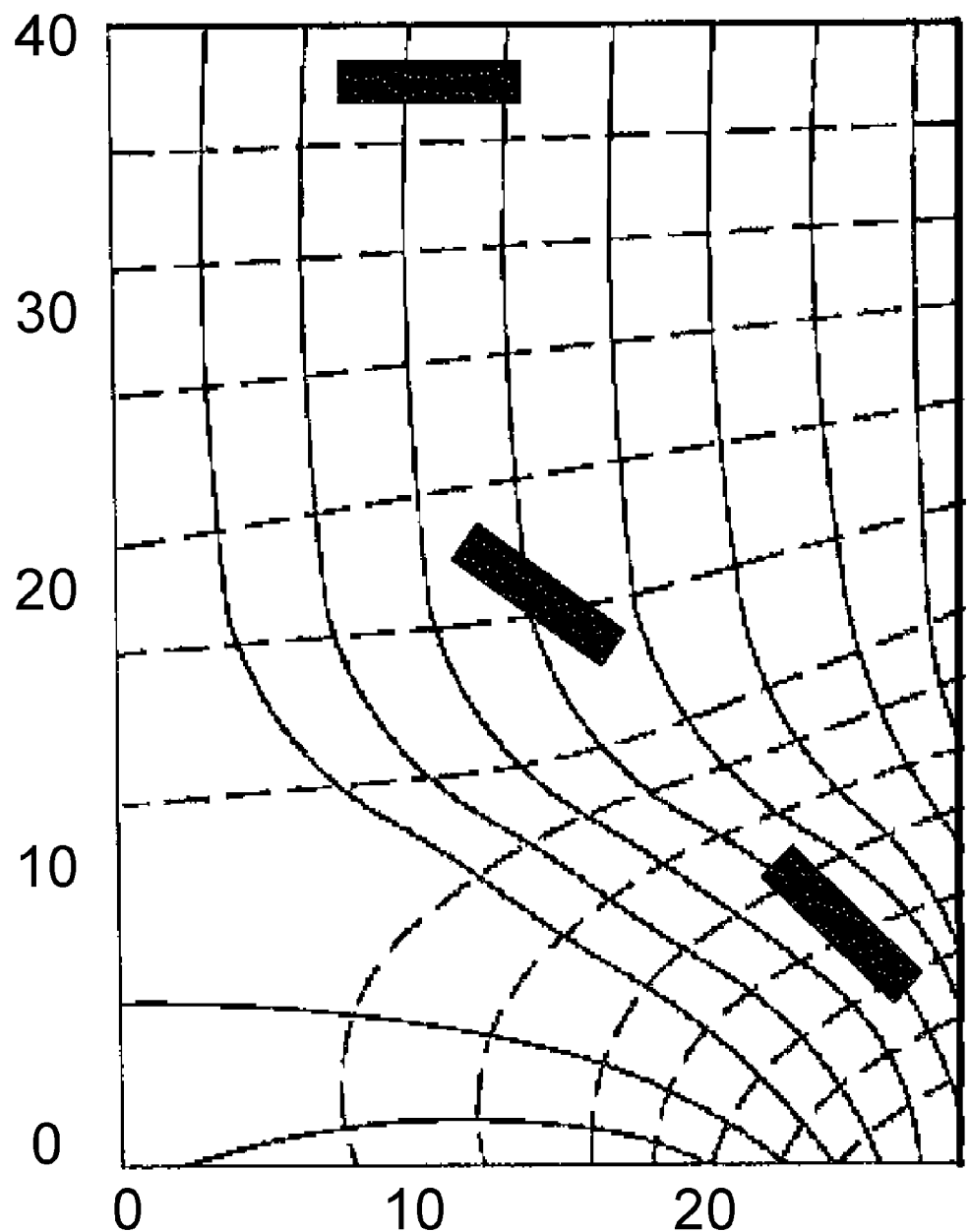
FIG. 10 shows the "flight path" of a long, thin electrical conductive particle in an electric field.

FIG. 10 shows the orientation and "flight path" of long, thin and conductive particles as the approach a landing on an image on the right hand corner of the bottom path. They will, in fact, land vertically and remain standing while the charges remain un-disrupted on the bottom plate. If we allow the charges to dissipate the CNT particles will collapse or fall down to the bottom plate but remain substantially in place. This will form a very conductive nest of fibers in the "image" of the charge holding regions (the exposed and therefore cross linked areas) of the bottom plate. They must now be permanently bonded together and bonded to the substrate. For example, a polyethylene terphthalate (PET) film coated with a Saran resin (Dow Chemicals; Midland, Mich.) may be used.

The mutual bonding may be achieved by use of an electroless plating process of a conductive, inexpensive metal like copper or nickel. Both have these desirable features: Nickel plates more rapidly than copper, Copper has approx 3× the conductivity of nickel. Both have surface oxidation problems, made worse by the transition to lead free solders demanded by the reasons of ecology (e.g., RoHS directives). Some applications, such as Copper Indium Di-selenide (Cu In Se2) are readily "poisoned" by copper and demand the use of nickel metal.

The nanotubes themselves may serve as an adequate catalyst to form a thin metallic bonding layer that "bonds" them together to retain the high initial conductivity. The metal bonding layer serves as a structure to which the lower adhesive-like layer can bond. The nanotubes are now bound together and fixed in place.

There exists published data on electroless plating of carbon nanofibers. See, U.S. Pub. Pat. App. 20040018371, expressly incorporated herein by reference.

First Alternate Embodiment of the Printing of Conductive Traces

An alternate Embodiment of the invention, for those situations where CNT are not adequately catalytic for economic productions, a separate "catalyst" toner will be printed. A typical toner is described in Example 4 of US Published Pat. Application 2005/0100810, expressly incorporated herein in its entirety. It is a sub-one micron particle of Palladium "buried" in an "organosol" resin. See Kosel, U.S. Pat. No. 3,900, 412, expressly incorporated herein by reference, which discloses a liquid toner which has a high electrical resistivity, e.g., in the order of at least $10^9$ ohm centimeters, and a dielectric constant of less than three and one-half, so that the liquid carrier will not dissipate the pattern of electrostatic charges which are to be developed in electrostatography. It has functioned effectively as a catalyst in electro-less plating processes. Other catalytic toners are obvious to those skilled in the art. The plating process finishes the printing process where the fibers are bonded together in a structure of a thin metal film (Cu or Ni) that can bond effectively.

Second Alternate Embodiment of the Printing of Conductive Traces

In this Embodiment, the metal plating step is eliminated as a bonding step. Rather, the nanotubes are bonded together by heat, as reported by Chung-Yen Hsiao & TeFong Chan (SID Digest 05, pg. 411-413), expressly incorporated herein by reference. They report that heating to 400 C to 560 C, will cause the carbon nanotubes to "bond" together. FIG. 6B shows an example of how this Embodiment can be used. A glass substrate with grounded anti-static layer of organic material (like PEDOT) is masked with a patterned photopolymer layer which is charged. The carbon nano-tubes are developed in the trenches by ordinary electrographic processes. These fibers are then bonded by suitable heating and the masked material optionally later removed.

Purification (Sorting) Using the "Tornado Experiment"

A classic experiment in electrostatics, the "tornado experiment", is illustrated in FIGS. 1A and 1B. The experiment involves conductive particles (denoted by the circles with + and −) and two conductive plates each with a voltage between them, one of positive polarity the other negative polarity. As the voltage between the plates is increased, the charged particles will be attracted to the plate with the opposite polarity. Upon landing, these particles will discharge and recharge oppositely and become attracted to the plate with the opposite polarity once again. This process is repeated, and the particles quickly form of a moving cloud of particles or a "tornado". It is noted that in fibers, a dipole charge arrangement may be developed. FIG. 1B shows the effect of a dielectric mask, which prevents discharge of the particle, and thus results in accumulation of oppositely charged particles. Thus, if the particles are intercepted by a dielectric film (noted as such in FIG. 1B), they will not discharge but rather be held fast by the electrostatic force pulling them toward that plate. Properly adapted, this process can be utilized to sort a collection of materials based on their conductivity.

FIGS. 3 and 4 illustrate how the tornado experiment, combined with a dry screened substrate, can be used to image bare metal particles using induction charging techniques. This process effectively mobilizes the conductive material while the non conductive and intrinsically charged materials stay at rest and/or adhere to the plate carrying the opposite charge. This could result in a first level sorting of conductive and non conductive particles. See, U.S. Pat. No. 5,817,874, expressly incorporated herein by reference.

Technique for Orienting the Particles—Heads or Tails

Figure 13:
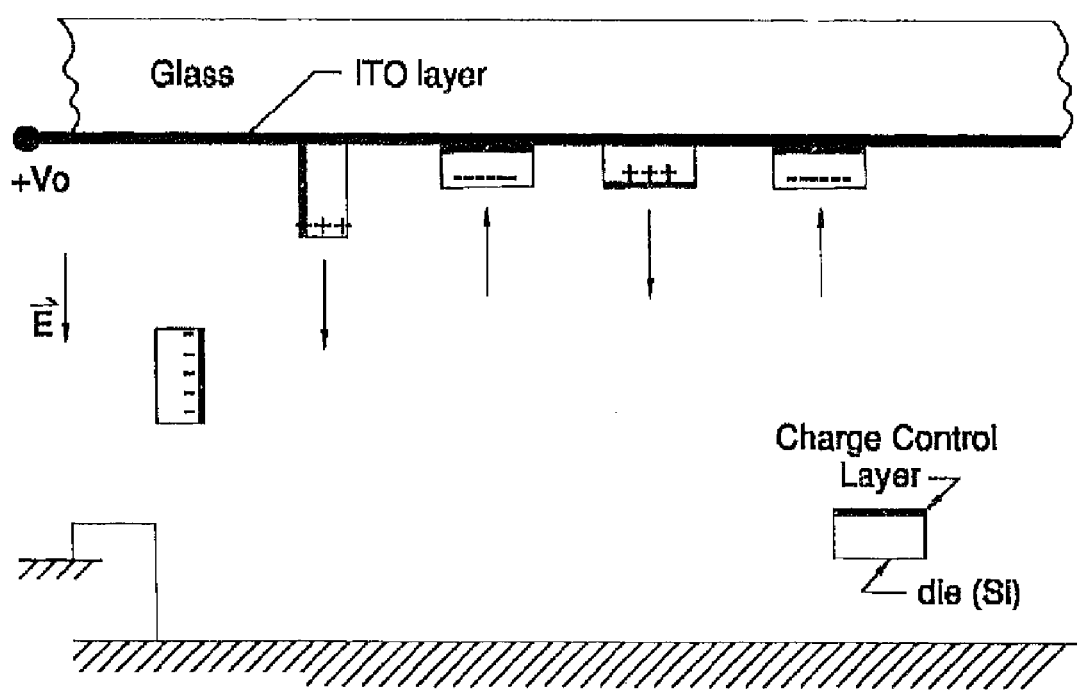
FIG. 13 shows an apparatus for orienting objects or particles with an asymmetric charge distribution.

Once the CNT material has been purified, it may be desirable to further separate the conductive from the semi-conductive material. FIG. 13 illustrates the orientation of particles having asymmetric charge distribution (in FIG. 13, much larger particles, i.e., Silicon die with area of 1 square millimeter for a low cost RFID tag) to illustrate what has already been achieved, but the same scheme should apply to smaller fibers. In FIG. 13, the die is coated on one side with a patterned dielectric material. If the chip lands on the dielectric it will stay, if not it will move to the bottom plate. A modification of FIG. 13 could be used to further separate conductive from semi conductive CNT's.

As shown in FIG. 13, a silicon die with dimensions of 1.65 mm×0.61 mm×0.10 mm thick is accurately aligned onto an antenna substrate via electrostatic forces. This process made use of a basic electrographic system comprised of a liquid toner and electrostatic printing plate. This method could be adapted to produce a massively parallel process to 'bulk align' nano-fibers.

The silicon die was made into a liquid toner particle and the antenna substrate, a flex circuit with conductive traces, was made into an electrostatic printing plate. The objective of this method was to move the silicon die through an electric field and land it in the correct location, with the appropriate orientation, on the antenna substrate. The antenna substrate had a voltage applied to it in order to create an electric field. As dielectrophoretic phenomena tend to cause acicular particles to align themselves with the field lines (See FIG. 10) the electric field was orientated appropriately to force the particle into the correct location and with the correct orientation.

Figure 14A:
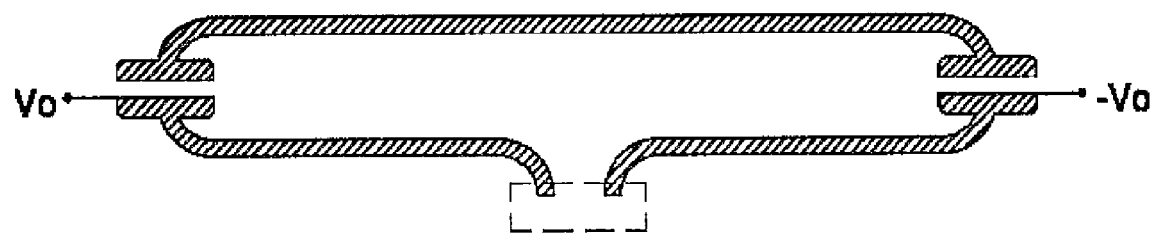
FIGS. 14A, 14B and 14C show the electrostatic positioning of semiconductor chips in a liquid medium on a substrate having a conductive trace.
Figure 14B:
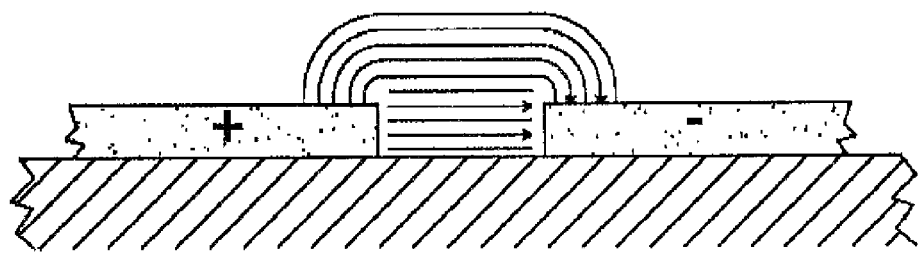
Figure 14C:
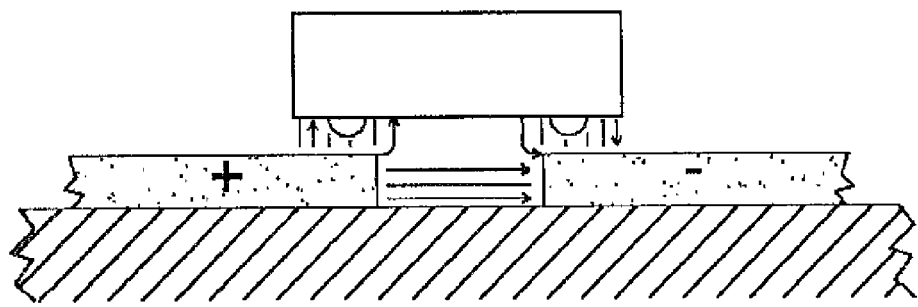

FIG. 14A shows an illustration of the antenna substrate with both a positive and negative voltage. The two terminals (indicated by a dashed rectangle) thus served as the source and drain electrodes of this simple transistor. When the voltage was applied, an electric field was created as illustrated in FIG. 14B. FIG. 14C shows how the die 'landed' in the right location with the correct orientation.

This example illustrates how a relatively larger particle has been made into a toner and accurately moved through an electrical field taking full advantage of electrostatic forces and leveraging other phenomena (e.g. dielectrophoretic phenomena). Similar results have been duplicated by on many occasions with toners comprised of significantly smaller particles.

Classification of Conductive CNT Material

Once this primary sorting process has been completed, it may then be possible to further separate the CNT material based on levels of conductivity in a process referred to as "classification". By modulating various factors such as amplitude and duration of an applied voltage, it may be possible to sort the conductive CNT material by varying levels of conductivity. Once separated in accordance with these characteristics, it would then be necessary to 'capture' the specific material in some way. Adapting techniques employed for manipulating other particles in this manner, FIG. 4 illustrates how the tornado experiment, combined with a dry screen substrate can be used to image bare metal particles using induction charging techniques to capture the particles. See, U.S. Pat. No. 5,817,874, expressly incorporated herein by reference. Another technique is show in FIG. 1B, where the particles with specific conductivity could be intercepted by a dielectric film (noted as such on the FIG. 2). In this case, the mobilized particles, upon hitting the dielectric tape, would not discharge, but rather be held fast by the electrostatic force pulling them toward that plate.

Once captured, the specific material could be removed and the process could be repeated to achieve the next level of material classification. Properly adapted variations of these and other techniques could be used to sort and classify collection of materials based on their levels conductivity. Likewise, a continuous process may be implemented instead of a batch process, by, for example, providing a continuous feed of unsorted particles which are selectively adhered to a rotating drum which effects a selection gradient (for example, exposure to light on a charged photoconductive drum will bleed charge, and thus permit a spatial gradient in charge intensity). The sorted material is then binned based on its adhesion (or non-adhesion) properties.

Identification of Intrinsic Charge and Electrochemical Properties

It may also be beneficial to evaluate what type of CNT material (conductive or non conductive) carries an intrinsic charge. For example, various configurations of CNTs, or levels of derivatization, may lead to different triboelectric properties. Thus, by subjecting a mixed set of particles to friction under controlled circumstances, the different particles may be separated using charge as a proxy for the underlying basis for the charge. Experiments could thus be used to detect the existence of the different properties, and identify its polarity (or the existence of both polarities) and other electrochemical and functional properties of the material.

Beyond the intrinsic charge, traditional liquid toner technology could be used to induce an electrochemical charge on specific particles. Ultimately, this could be used to identify whether particular material has an acidic or basic charge, or whether it assumes a neutral charge. This could be achieved using various polyelectrolytes.

CNT Toners

While dry conductive particles may be employed, with respect to CNTs, at least, it is preferable to disperse the fibers in a dielectric liquid (effectively, a liquid toner). This approach would be more desirable for several specific reasons including:

Control of agglomeration—for many prospective applications, it is important to ensure that CNTs do not agglomerate to one another or to other components within a mixture. Liquid toners control this very nicely as the particles in suspension carry a similar charge and thus are repelled from one another.

Particle Size—CNT particles can be quite small, e.g., tubes with diameters of as little as 0.7 nm and lengths of <500 nm. Handling such particle in the dry state is virtually impossible so we will disperse then in a convenient solvent where Van der Waals forces are substantially reduced. The liquid state confines the particles within the liquid substantially reducing health hazards also.

Electrochemical advantages—it is possible to impart an electrochemical charge on the particles using liquid toner techniques. This has the added advantage of allowing distinctions to be made based on the surface chemistry of the particle (i.e. acidic, basic, neutral functionality).

Spatial Placement and Alignment of Nano-wires

The present invention also provides methods, in which purified and classified nano-wire material in a liquid toner could be: Oriented parallel to a common plane; Oriented in a direction defined by the source and drain electrodes; and/or Bulk aligned onto a substrate (flex circuit).

By the same token, the techniques proposed may lend itself to the production of parallel bundles and coat surfaces with fibers perpendicular to the plane of the surface ("flocking").

Third Alternate Embodiment of the Invention.

Figure 15:
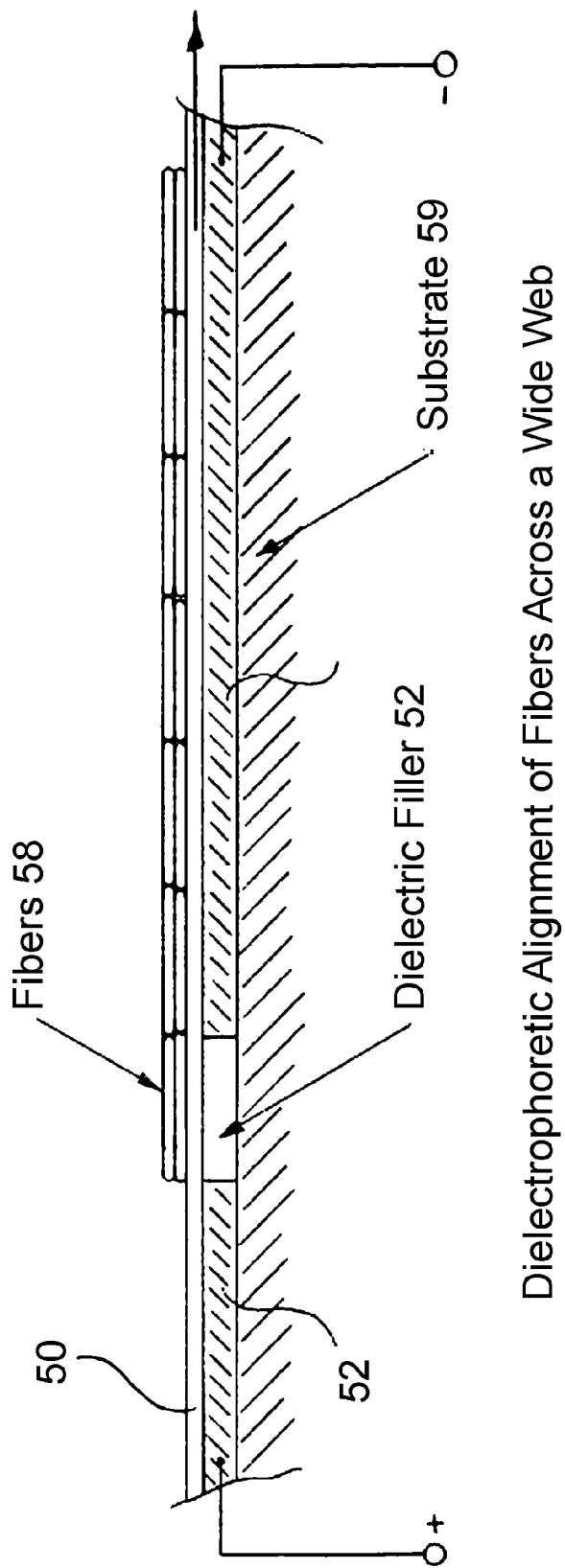
FIG. 15 shows a schematic for the manufacture of two-dimensional webs of ordered nanofiber.

FIG. 15 shows a schematic of a technique for the manufacture of large webs of carbon nano-fibers substantially aligned in one direction on top of a thin polymeric film. Film 50 is a thin web, e.g., 50 μm thick, that is moved across two broad area electrodes 52, 54. The web is e.g., 300 mm wide; the electrodes are wide but are overlapped by about 5 or 10 mm. A dielectric material 56 fills the gap between the electrodes to preclude electrical breakdown as might occur if just air existed between the electrodes. Nano-fibers in the liquid fill the space above the web.

The gap between the electrodes is sized to approximate the average length of the nano-tubes to be deposited on the film. The electric fields that fringe through the web attract and align nano-tubes in an orderly manner between the electrodes.

Once settled on the film, the fibers 58 remain in place due to short range forces causing them to adhere to the film. See R Baughman, Nanotechweb, 22 Nov. 2004, expressly incorporated herein by reference. As the web moves to the right, new fibers appear across the gap between the electrodes, but on the other side of the web, of course.

The voltage applied across the electrodes depends on gap length, web thickness and speed desired out of the process. Design guidelines suggest that the applied voltage be raised to the limit imposed by random breakdown in the trace air gaps that develop in the moving web.

Fourth Alternate Embodiment of the Invention.

Figure 16:
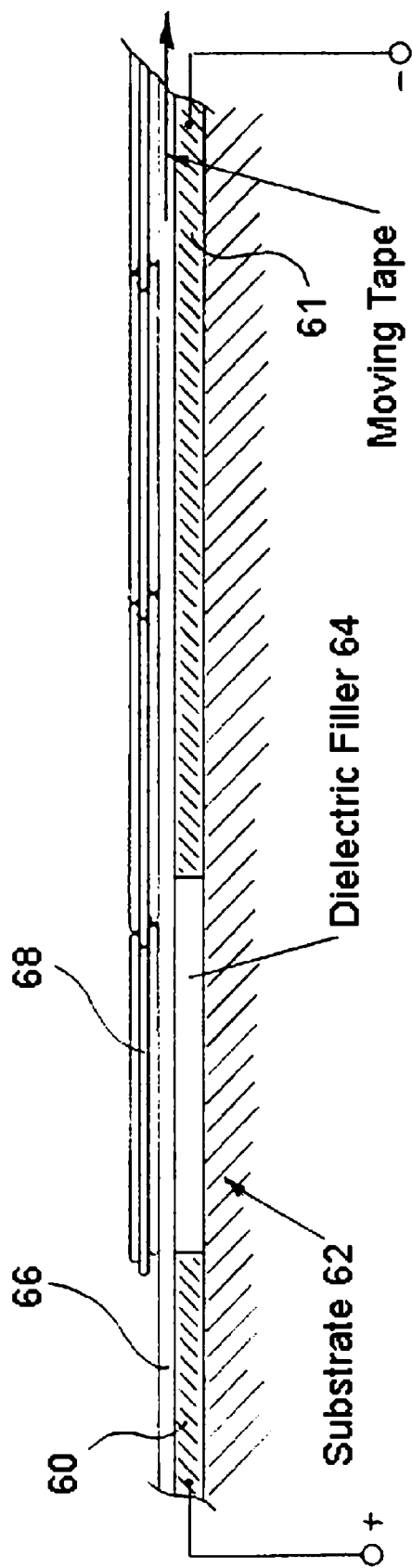
FIG. 16 shows a schematic of a process for producing one-dimensional conducting "wires" or textile yarn.

FIG. 16 shows a schematic of a process for the manufacture of electrical "wire" or textile "yarn". The difference is that wire is made from conducting or "metallic" nanotubes while the yarn is made from insulating fiber.

Two electrodes 60, 61 are mounted on an insulating substrate, 62 with a gap between them filled with a suitable dielectric material 64 to suppress electrical sparking between the electrodes. A thin, narrow film tape (about 50 μm thick of PET) 66 covers the two electrodes, and is drawn to the right by means not shown.

The electrodes are as wide in the dimension normal to the surface of FIG. 16 as one needs to determine the width of the wire. 100 μm wide electrodes would produce a wire the equivalent to that of a 20 AWG wire. 2.5 mm wide electrodes would produce a wide tape-like wire.

The gap between the electrodes is adjusted according to the tape thickness, average tube length and the dielectric constant of the tape. High dielectric constant materials like the fluorpolymer Tedlar® (DuPont) at about 8.0 require larger gaps than do the polyester materials with a dielectric constant of 3.3.

Note, by arraying several pairs of electrodes across a web of modest width we can produce several wires or ropes simultaneously.

A voltage is applied between electrodes 60, 61. The electric fields that fringe through the tape will then attract the nanofibers to the surface of the tape in an orderly manner. Short range forces and fiber-to-fiber friction cause the fibers to bond strongly together. See R Baughman reference.

EXAMPLE 1

To make a positively charged, carbon nanotube liquid toner; 500 mg of multi-wall nanotubes with hydroxyl (—OH) functionality, Timesnanoweb product #MQ 1228 (National Nanosciences & Nanotechnology Center, Chengdu. PR China) are dispersed in 100 g of Isopar G® (CAS 64742-48-9 consisting of predominantly of $C_{10}$-$C_{11}$ isoparaffinic hydrocarbons) with Hunt Imaging #12-76 polyelectrolyte, approx 5 to 10 drops (for a bath conductivity of 8 to 12 pico mho per cm). The mixture is stirred for approx 4 hours before testing.

EXAMPLE 2

Another positively charged, nanotube toner is made from sidewall alkylation of fluorinated Single Wall Nano-Tubes (SWNT) as described in Boul, et. al., Chem. Phys. Letters, 1999, pg. 310, 367, expressly incorporated herein by reference. An appropriate quantity is dispersed in a volume of diluent with Hunt Imaging #12-76 to yield a bath conductivity from 10 to 20 pico mhos per cm.

EXAMPLE 3

A negatively charged toner is made with acidic functional material such as described by Chen, et, al., J. Phy. Chem. B, 2001, V-105, pg. 2525-2528, expressly incorporated herein by reference. Here carboxylic acid groups are present in the purified SWNT that ionize with the charge director forming an inverse micelle, leaving a negative charge on the nanotube. In this case, the charge director is either basic Barium Petronate® (Witco Chemical Co, Greenwich Conn.) or Indigo Imaging Agent (HP Co, Palo Alto, Cal.).

EXAMPLE 4

A negative charged toner using carbon nano-tubes with an acidic functionality, i.e, partially coated with carboxylic acid groups is provided. 500 mg of Timesnanoweb Product #MS1238 (see Exp 1), larger than 50 nm in length and with 95+% carboxylic acid functionality is dispersed in 100 g of Isopar G® with 1 drop of basic Barium Petronate®, and stirred from 4 to 6 hours. The charge director dose is adjusted to yield a working bath conductivity of 10 to 20 picomhos per cm.

EXAMPLE 5

A catalytic toner was prepared with the following ingredients:
2 g of palladium powder, Aldrich Chemical #32666-6
17 g of organosol resin, JB-8-1 (see U.S. Pat. No. 6,171,740)
100 mg of Zr Hex Cem®, OMG Americas Inc., Westlake, Ohio
100 g of Isopar L® (CAS 64742-48-9 Naphtha (petroleum), hydrotreated heavy, consisting predominantly of $C_{11}$-$C_{13}$ isoparaffinic hydrocarbons), Exxon/Mobil Inc.; Houston, Tex.

The mixture was dispersed in a vertical bead mill for 1.5 hours at 2,000 rpm. The resulting toner had these characteristics: Mean particle size 0.33 micro; Conductivity 17 pico mho per cm.

EXAMPLE 6

The carbon nanotubes, with or without the additional catalytic toner of Example 5, are plated with a suitable metal such as Shippley Inc, CuPosit™ 328 solution (Dow Chemical Co.). The samples are immersed in the bath for 10 min, at a temperature of 35 C to 40 C. 1 to 1.5 microns of copper metal are found to have been deposited.

EXAMPLE 7

The nano-tube images of Example 6 are plated with electroless nickel in the following manner. The imaged samples are immersed in MacDermid Inc Planar Electroless Nickel/Immersion Gold solution, (MacDermid Inc, Waterbury, Conn.) for 2 minutes and 0.5 microns of nickel metal was found to have been deposited.

EXAMPLE 8

Ordinary soda lime glass (2.75 mm thick) which is coated with approx 10 microns of PEDOT Poly(3,4-ethylenedioxythiophene)-polystyrenesulfonate, (Baytron® P 158, Bayer A.G. Germany), is laminated and patterned with a suitable photo-polymer. The photo-polymer is charged and the nanotubes are developed in the trenches. The glass is heated to temperatures in the 400 to 560 C range for a suitable period of time to bond the fibers together.

While the invention has been described with reference to the preferred Embodiments thereof, it will appreciated that various modifications can be made to the parts and methods that comprise the invention without departing from the spirit and scope thereof.

What we claim is:

1. A method for transporting nanofibers, comprising:
    freely suspending a plurality of electrochemically charged nanofibers in a liquid dielectric medium, the electrochemical charge being generated by a charge director composition in the liquid dielectric medium, wherein the liquid dielectric medium has a resistivity dependent on at least the a concentration of the charge director of between $10^9$ and $1.25 \times 10^{11}$ ohm-cm, and an induced charge on the nanofibers is maintained absent contact with a conductor;
    inducing a charge on the plurality of nanofibers due to ohmic contact with a conductive surface;
    interposing a low leakage dielectric barrier between a conductive substrate and an electrode;
    subjecting the at least a portion of the freely suspended electrochemically charged and induction charged nanofibers in the dielectric medium to an electrical field between the electrode and the conductive substrate, through the dielectric barrier; and
    causing the at least a portion of the freely suspended electrochemically charged and induction charged nanofibers to migrate due to an electrostatic force based on at least the electrical field and a conductivity of the respective nanofibers, to a surface of the dielectric barrier,
    the dielectric barrier and dielectric medium being configured to prevent discharge of the charged nanofibers and thereby selectively cause an electrostatic accumulation on the dielectric barrier, and
    the conductive substrate being configured to discharge the induced charge on the electrochemically charged and induction charged nanofibers with an opposite polarity induced charge, by contact with the conductive substrate, to thereby selectively inhibit electrostatic accumulation of the nanofibers on a surface of the conductive substrate exposed to the liquid dielectric medium,
    wherein the nanofibers have an elongated axis, and wherein the electrical field affects an alignment of the elongated axes of the nanofibers, further comprising preserving the alignment of the elongated axes of the migrated nanofibers after removal of the electric field from the aligned nanofibers.

2. The method according to claim 1, wherein nanofibers with respectively different nanofiber conductivity migrate to different locations of the surface of the dielectric barrier.

3. The method according to claim 1, wherein the nanofibers are freely suspended in a paraffinic liquid having a conductivity of less than about 20 pico mhos per cm.

4. The method according to claim 1, further comprising the step of electroless plating the migrated nanofibers with a metal after migration, to produce a composite material of nanofibers within a metal matrix.

5. The method according to claim 1, wherein the nanofibers migrate to form a uniform coating on the dielectric barrier having a nanofiber orientation normal to a planar surface.

6. The method according to claim 1, wherein the nanofibers migrate to form a uniform coating on the dielectric barrier having an anisotropic orientation of nanofibers substantially parallel to a surface.

7. The method according to claim 1, wherein the nanofibers migrate to form a uniform coating on the dielectric barrier having an isotropic orientation of nanofibers substantially parallel to a surface.

8. The method according to claim 1, wherein the nanofibers migrate to form a uniform coating on the dielectric barrier having a random orientation of nanofibers on a surface.

9. The method according to claim 1, wherein the migrated nanofibers are conductive, and the accumulated fibers are interconnected to form a set of conductive traces longer than a single nanofiber.

10. The method according to claim 1, further comprising the step of heating the migrated nanofibers to bond them together.

11. The method according to claim 1, wherein the nanofibers migrate to form a conductive bundle having a length greater than a length of a respective nanofiber, the bundle being continuously drawn from the electrostatic field.

12. The method according to claim 1, wherein the nanofibers migrate to form a substantially non-conductive bundle having a length greater than a length of a respective nanofiber, the bundle being continuously drawn from the electrostatic field.

13. The method according to claim 1, wherein the nanofibers have an elongated axis, the elongated axis of the migrated nanofibers being oriented normal to a surface plane of the dielectric barrier, which comprises a support surface, and are configured to serve as electron emitters.

14. The method according to claim 1, wherein the nanofibers comprise carbon nanotubes.

15. The method according to claim 1, wherein the nanofibers comprise inorganic nanotubes.

16. The method according to claim 1, wherein the nanofibers selectively migrate to form a semiconductive portion of an active semiconductor electronic device structure.

17. The method according to claim 1, wherein the nanofibers selectively migrate to the dielectric barrier, disposed between a pair of conductive electrodes comprising a source and a drain, to form a semiconductive channel portion of a field effect transistor.

18. The method according to claim 17, wherein the dielectric barrier comprises an insulator between the semiconductive channel and the substrate, and further comprising forming a gate electrode over the migrated nanofibers, the gate being configured to electrically modulate a conductivity of the migrated nanofibers to control an electrical current flow between the source and drain.

19. The method according to claim 1, wherein the liquid dielectric medium comprises polyvinyl lecithin.

20. The method according to claim 1, wherein the migrated nanofibers form a chemically responsive part of a chemical sensor which modulates an electric current in response to chemical changes.

21. The method according to claim 1, wherein the migrated nanofibers are semiconductive, and have a conductivity which is chemically responsive.

22. The method according to claim 1, wherein the migrated nanofibers are deposited as a layer comprising stacks of highly ordered nanofibers on a continuous web.

23. A method for transporting nanofibers comprising:
providing a plurality of charged nanofibers in a liquid dielectric medium configured to maintain a respective induced charge on at least a portion of the plurality of nanofibers suspended therein, comprising a charge director, configured to electrochemically charge the plurality of nanofibers, said nanofibers being freely suspended and motile within the liquid dielectric medium, wherein the resistivity of the a liquid dielectric medium is between $10^9$ and $1.25 \times 10^{11}$ ohm-cm, and wherein the charge director is present in an amount sufficient to generate an electrochemically induced charge to electrostatically maintain the accumulated nanofibers at the dielectric barrier and in an amount limited to maintain an induced charge on the suspended and motile nanofibers;
providing an electrode, having at least a portion separated by a low leakage dielectric barrier from the medium, wherein an electric field between the electrode and a counterelectrode is adapted configured to extend through the dielectric barrier and the liquid dielectric medium, the dielectric barrier being configured to prevent discharge of an induced charge on charged nanofibers in contact therewith while nanofibers in contact with the electrode are ohmically discharged and charged with an induced charge of opposite polarity, the liquid dielectric medium having a conductivity sufficiently low to preserve the induced charge formed on the nanofibers;
imposing an electrostatic potential on the electrode with respect to the counterelectrode, extending through the liquid dielectric medium, to thereby induce an electrostatic force and a dielectrophoretic force on the charged nanofibers; and
migrating, under influence of the electric field, at least a portion of the charged nanofibers freely suspended within the liquid dielectric medium toward the dielectric barrier to form at least one accumulated layer thereon having a higher density of nanofibers than in a bulk of the liquid dielectric medium, the accumulated charged nanofibers maintaining their charge after contacting the dielectric barrier, a migration of a nanofiber being dependent on at least the electrical field proximate to the fiber and a respective nanofiber conductivity,
wherein charged nanofibers selectively accumulate in a dielectrophoretically aligned fashion at the dielectric barrier but not at the electrode, further comprising preserving the alignment of the accumulated layer of nanofibers at the dielectric barrier after removal of the electric field.

\* \* \* \* \*